(12) United States Patent
Kao

(10) Patent No.: US 7,361,955 B2
(45) Date of Patent: Apr. 22, 2008

(54) HIGH-VOLTAGE MOS DEVICE WITH DUMMY DIFFUSION REGION

(75) Inventor: Ching-Hung Kao, Hsin-Chu Hsien (TW)

(73) Assignee: United Microelectronics Corp., Hsin-Chu (TW)

( * ) Notice: Subject to any disclaimer, the term of this patent is extended or adjusted under 35 U.S.C. 154(b) by 113 days.

(21) Appl. No.: 11/164,846

(22) Filed: Dec. 7, 2005

(65) Prior Publication Data

US 2006/0278924 A1 Dec. 14, 2006

Related U.S. Application Data

(60) Provisional application No. 60/595,203, filed on Jun. 14, 2005.

(51) Int. Cl.
*H01L 29/76* (2006.01)
*H01L 29/94* (2006.01)

(52) U.S. Cl. ............... 257/339; 257/328; 257/335; 257/336

(58) Field of Classification Search .............. 257/107, 257/133, 328, 334–336, 338, 339, 344, 483, 257/484, E29.027
See application file for complete search history.

(56) References Cited

U.S. PATENT DOCUMENTS 4,084,175 A * 4/1978 Ouyang ............... 257/336
6,870,223 B2 * 3/2005 Kumagai et al. ........ 257/343

* cited by examiner

*Primary Examiner*—Hung Vu
(74) *Attorney, Agent, or Firm*—Winston Hsu

(57) ABSTRACT

A high-voltage MOS device includes a substrate; a drift ion well formed in the substrate; a first isolation region formed in the drift ion well; a gate electrode formed on the substrate and covering a portion of the first isolation region; a drain doping region disposed adjacent to the first isolation region on an opposite side to the gate electrode; a second isolation region formed in the drift ion well, the second isolation region being disposed adjacent to the drain doping region on an opposite side to the first isolation region; and a first dummy diffusion region in the drift ion well, the dummy diffusion region being disposed at a side of the second isolation region opposite to the drain doping region.

10 Claims, 4 Drawing Sheets

HIGH-VOLTAGE MOS DEVICE WITH DUMMY DIFFUSION REGION

CROSS REFERENCE TO RELATED APPLICATIONS

This application claims the benefit of U.S. provisional application No. 60/595,203, filed Jun. 14, 2005.

BACKGROUND OF THE INVENTION

1. Field of the Invention

The present invention relates to high-voltage devices and, more particularly, to an improved high-voltage metal-oxide-semiconductor (MOS) transistor device, which is capable of withstanding a higher breakdown voltage and increasing saturation drain current ($I_{DS}$) thereof.

2. Description of the Prior Art

In current semiconductor processing, controllers, memories, circuits of low-voltage operation and power devices of high-voltage operation are largely integrated into a single chip to achieve a single-chip system. The power device, such as vertical double-diffusion metal-oxide-semiconductor (VDMOS), insulated gate bipolar transistor (IGBT) and lateral diffusion MOS (LDMOS), is employed to increase power switching efficiency and decrease the loss of energy resources. It is often required that the switching transistors withstand high breakdown voltages and operate at a low on-resistance.

Double diffuse drain (DDD) technology has been extensively applied to the source/drain (S/D) in order to provide a higher breakdown voltage. The DDD structure suppresses the hot electron effect caused by the short channel of the MOS transistor to further avoid electrical breakdown of the source/drain under high operational voltages. LDMOS transistors are particularly prevalent because they can operate with a high efficiency and their planar structure allows for easy integration on a semiconductor die with other circuitry.

FIG. 1 is a schematic, cross-sectional diagram illustrating a prior art symmetric high-voltage NMOS device. The high-voltage NMOS device 10 is formed in a P substrate 12. A gate electrode 22 is formed on the P substrate 12. A gate dielectric layer 24 is interposed between the gate electrode 22 and the substrate 12. A first isolation region 32 is formed between an N+ source/drain region 34 and the gate electrode 22. Two spaced-apart N type drift ion wells 36 are provided in the P substrate 12 to encompass the N+ source/drain region 34 and the first isolation region 32. A channel region 40 is located between the two spaced-apart N type drift ion wells 36. A second isolation region 38 is formed on a side of the source/drain region 34 opposite to the first isolation region 32 for isolating the high-voltage NMOS device 10 from other devices.

One approach to increasing the breakdown voltage of the above-described high-voltage NMOS device 10 is reducing the dopant concentration of the N type drift ion wells 36 and/or the dopant concentration of the N+ source/drain region 34. This is disadvantageous because reducing the dopant concentration of the ion wells leads to low saturation drain current ($I_{DS}$). Another approach to increasing the breakdown voltage of the above-described high-voltage NMOS device 10 is increasing the distance between the drain 34 and the gate electrode 22. However, this will consume more chip real estate.

In light of the above, there is need in this industry to provide a high-voltage MOS transistor that can withstand higher breakdown voltage without increasing the chip size or reducing saturation drain current ($I_{DS}$).

SUMMARY OF THE INVENTION

It is the primary object of the present invention to provide a HVMOS device, which is capable of withstanding a higher breakdown voltage and increasing saturation drain current ($I_{DS}$).

According to the claimed invention, a high-voltage metal-oxide-semiconductor (MOS) device is disclosed. The high-voltage MOS device includes a semiconductor substrate of a first conductivity type; a drift ion well of a second conductivity type formed in the semiconductor substrate; a first isolation region formed in the drift ion well; a gate electrode formed on the semiconductor substrate and covering a portion of the first isolation region; a drain doping region of the second conductivity type disposed adjacent to the first isolation region on an opposite side to the gate electrode; a second isolation region formed in the drift ion well, the second isolation region being disposed adjacent to the drain doping region on an opposite side to the first isolation region; and a first dummy diffusion region of the second conductivity type in the drift ion well, the dummy diffusion region being disposed at a side of the second isolation region opposite to the drain doping region.

From one aspect of the present invention, a high-voltage LDMOS device is provided. The high-voltage LDMOS device includes a semiconductor substrate of a first conductivity type; an ion well of a second conductivity type formed in the semiconductor substrate; a first gate electrode formed on the semiconductor substrate; a second gate electrode formed on the semiconductor substrate and space-apart from the first gate electrode; a drain doping region of the second conductivity type disposed in the ion well approximately at a midpoint between the first and second gate electrodes; an isolation region formed in the ion well, the isolation region being disposed between the drain doping region and the first gate electrode and between the drain doping region and the second gate electrode; a plurality of dummy diffusion regions of the second conductivity type disposed in the isolation region; and a source region disposed in the ion well at a side of the first gate electrode or second gate electrode opposite to the isolation region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 2:
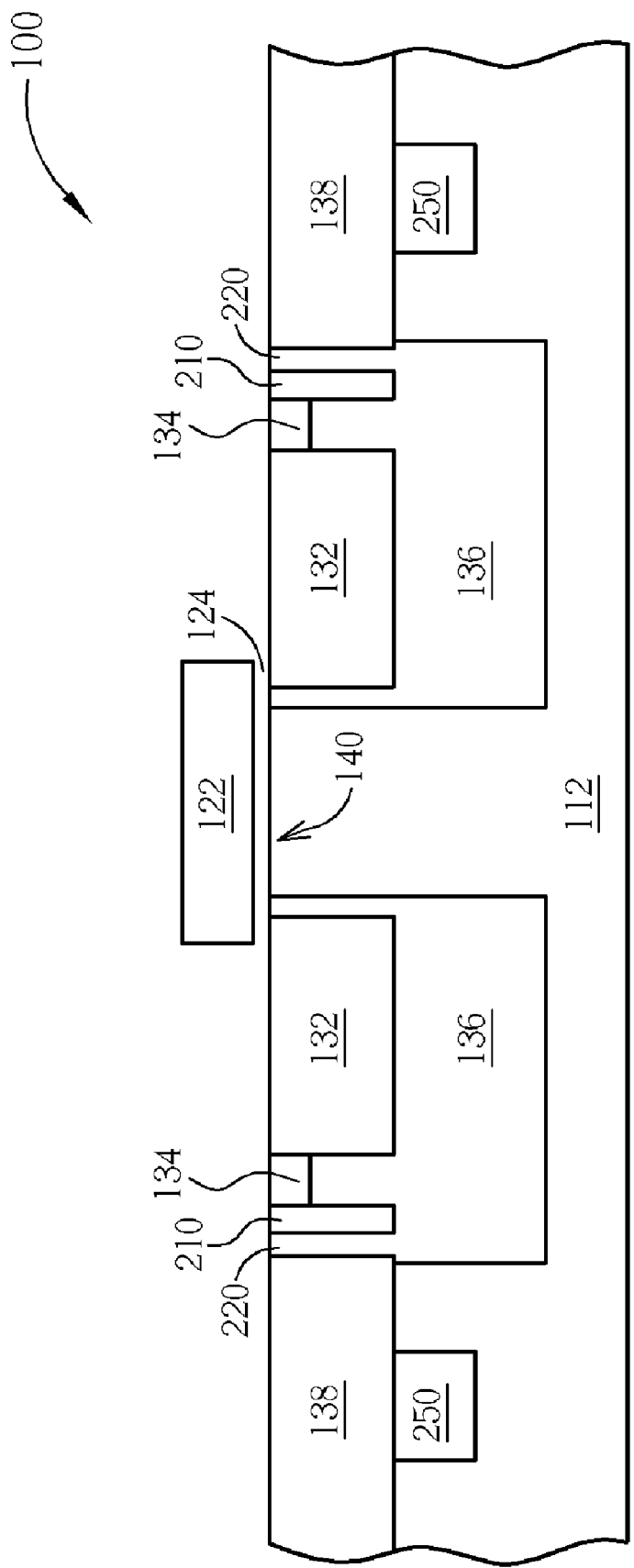
FIG. 2 is a schematic, cross-sectional diagram illustrating a high-voltage MOS device in accordance with the first preferred embodiment of this invention.

Please refer to FIG. 2. FIG. 2 is a schematic, cross-sectional diagram illustrating a high-voltage MOS device 100 in accordance with the first preferred embodiment of this invention. For exemplary purposes, the high-voltage MOS device 100 is an NMOS transistor. It is to be understood that the high-voltage MOS device 100 may be a PMOS transistor with proper modification of conductivity types. As shown in FIG. 2, the high-voltage MOS device 100 is formed in a P substrate 112. Likewise, a gate electrode 122 is formed on the P substrate 112. A gate dielectric layer 124 is interposed between the gate electrode 122 and the substrate 112.

According to the first preferred embodiment, a monolithic shallow trench isolation (STI) region 132 is inlaid into the substrate 112 between an N+ source/drain region 134 and the gate electrode 122. It is to be understood that, in other cases, the STI regions may be replaced with LOCOS field oxide layers. Two spaced-apart N type drift ion wells 136 are provided in the P substrate 112 to encompass the N+ source/drain region 134 and the first isolation region 132, respectively. A channel region 140 is located between the two spaced-apart N type drift ion wells 136.

It is one salient feature of the present invention that a dummy STI region 210 is formed in the drift ion well 136 and is deliberately disposed adjacent to the N+ source/drain region 134 on an opposite side with respect to the STI region 132. As seen in FIG. 2, the dummy STI region 210 borders the N+ source/drain region 134. The dummy STI region 210 isolates an N type dummy diffusion region 220 of the N type drift ion well 136. The N type dummy diffusion region 220 is disposed at a side of the dummy STI region 210 opposite to the N+ source/drain region 134. A peripheral STI region 138 is provided for isolating the high-voltage NMOS device 100 from other devices. A P+ guard ring diffusion region 250 is provided underneath the peripheral STI region 138 to surround the high-voltage NMOS device 100. The N+ source/drain region 134 may further comprise a silicide or salicide layer (not shown).

It has been experimentally confirmed that by providing the N type dummy diffusion region 220 and the dummy STI region 210, the concentrated highest electric field can be laterally shifted away from the channel region 140. This improves the breakdown voltage of the high-voltage MOS transistor 100.

Figure 1:
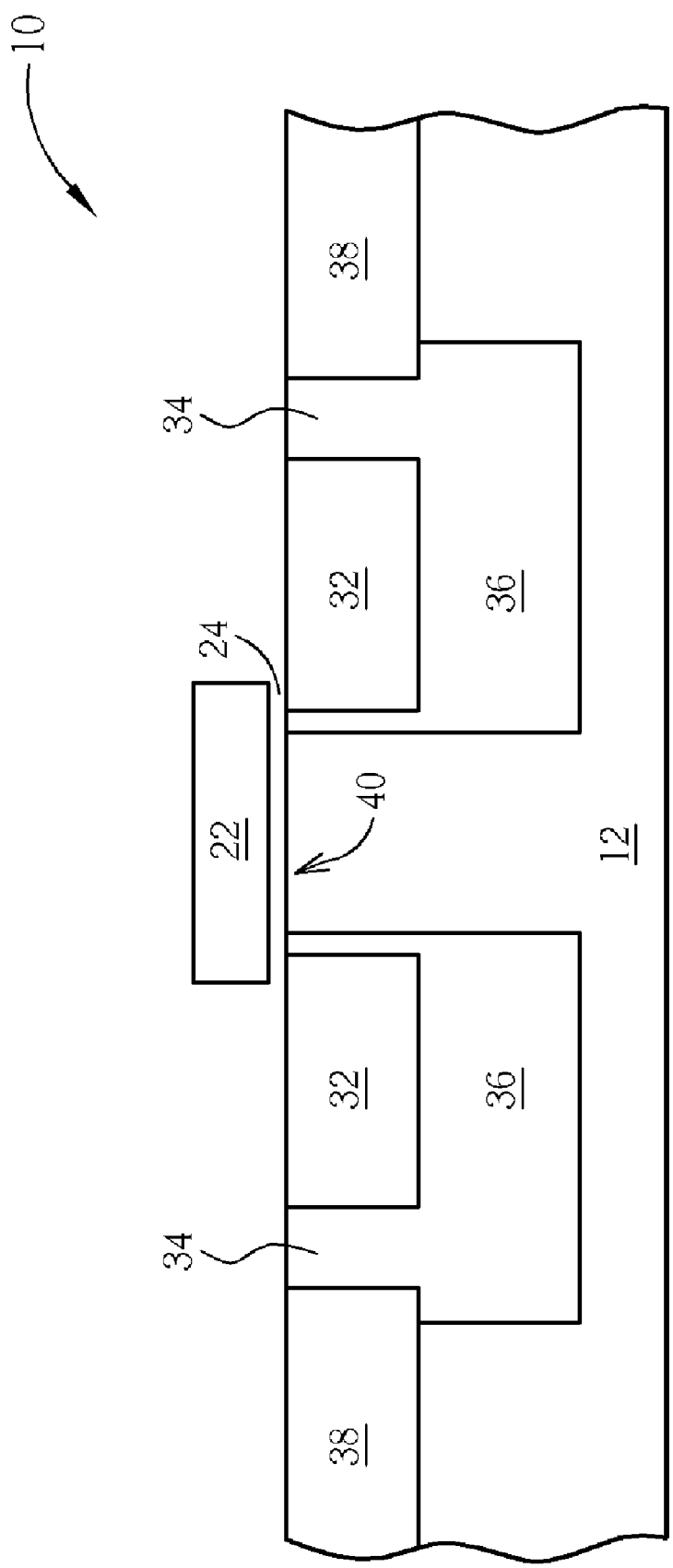
FIG. 1 is a schematic, cross-sectional diagram illustrating a prior art symmetric high-voltage NMOS device.

Generally, the prior art high-voltage MOS transistor 10 of FIG. 1 is capable of withstanding a breakdown voltage of about 61-62V. According to the simulation data, the highest electric field originally occurs at the interface between the source/drain region 34 and the peripheral STI region 38 of FIG. 1. By contrast, after incorporating the dummy diffusion region 220 and the dummy STI region 210, the high-voltage NMOS transistor 100 of FIG. 2 is capable of withstanding a breakdown voltage of about 68-69V. The highest electric field is shifted to the interface between the dummy diffusion region 220 and the peripheral STI region 138 of FIG. 2, away from the N+ source/drain region 134 and the channel region 140.

Figure 3:
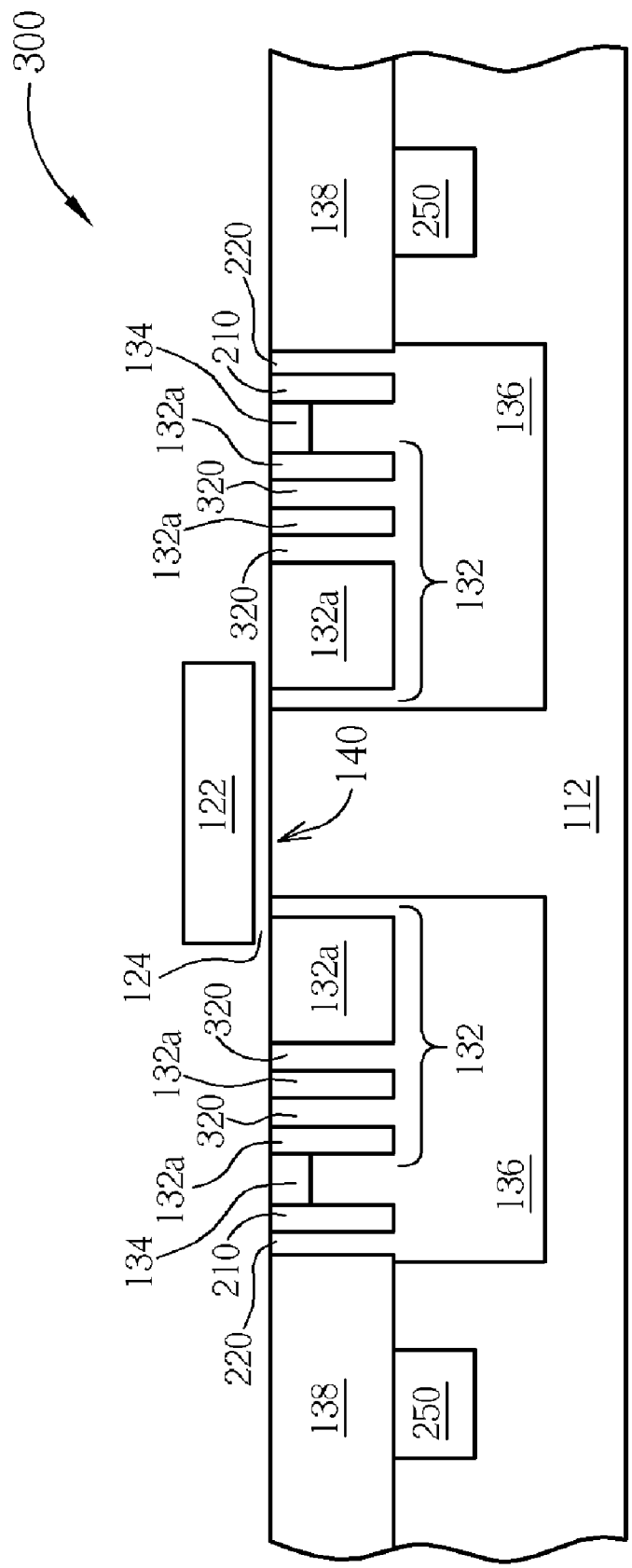
FIG. 3 is a schematic, cross-sectional diagram illustrating a high-voltage MOS device in accordance with the second preferred embodiment of this invention.

Please refer to FIG. 3. FIG. 3 is a schematic, cross-sectional diagram illustrating a high-voltage NMOS device 300 in accordance with the second preferred embodiment of this invention. The difference between the high-voltage NMOS device 300 shown in FIG. 3 and the high-voltage NMOS device 100 shown in FIG. 2 is that the STI region 132 disposed between the gate electrode 122 and the N+ source/drain region 134 is not monolithic. According to the second preferred embodiment, the STI region 132 is divided into several sub-STI regions 132a by interposing dummy diffusion regions 320 therebetween.

As shown in FIG. 3, a dummy STI region 210 is also formed in the drift ion well 136. The dummy STI region 210 is disposed adjacent to the N+ source/drain region 134 on an opposite side with respect to the STI region 132. Similarly, the dummy STI region 210 isolates an N type dummy diffusion region 220 of the N type drift ion well 136. The N type dummy diffusion region 220 is disposed at a side of the dummy STI region 210 opposite to the N+ source/drain region 134. A peripheral STI region 138 is provided for isolating the high-voltage NMOS device 300 from other devices. P+ guard ring diffusion region 250 is provided underneath the peripheral STI region 138 to surround the high-voltage NMOS device 300. It has been experimentally shown that both the saturation drain current ($I_{DS}$) and the breakdown voltage of the high-voltage NMOS device 300 are increased.

Figure 4:
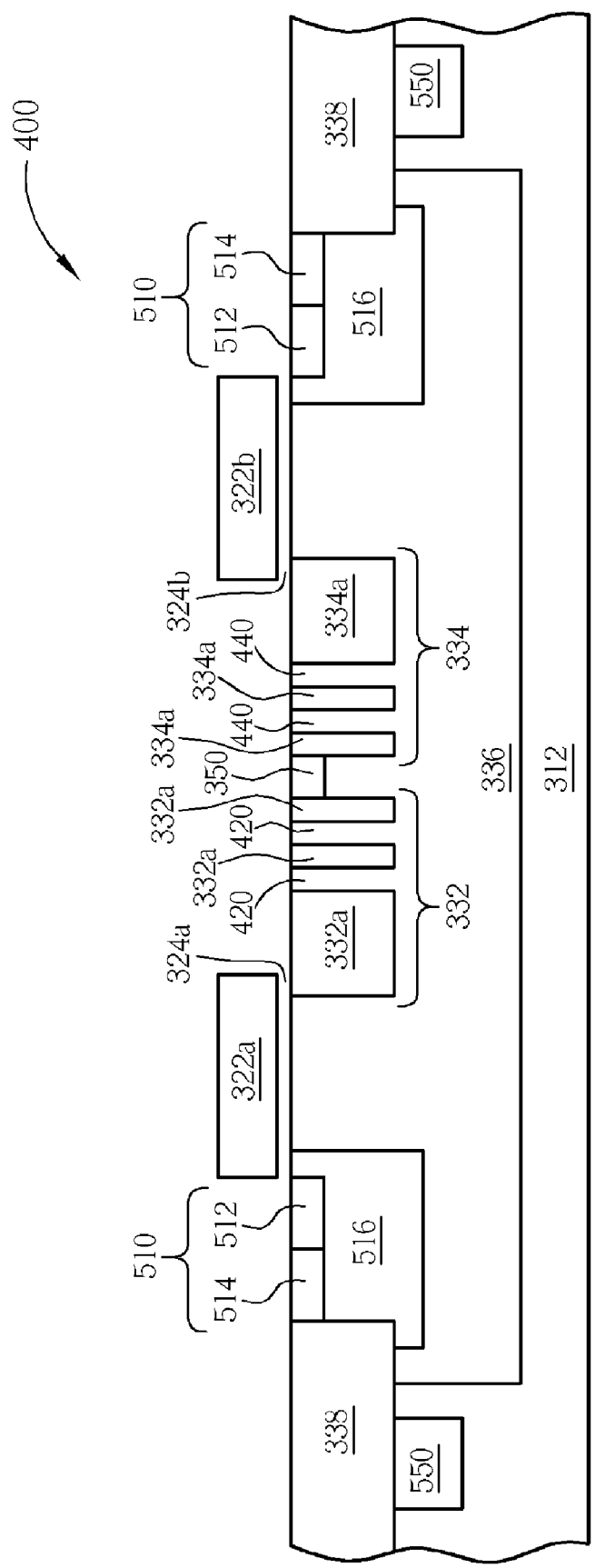
FIG. 4 is a schematic, cross-sectional diagram illustrating a high-voltage LDMOS device in accordance with the third preferred embodiment of this invention.

Please refer to FIG. 4. FIG. 4 is a schematic, cross-sectional diagram illustrating a high-voltage LDMOS device 400 in accordance with the third preferred embodiment of this invention. As shown in FIG. 4, the high-voltage LDMOS device 400 is formed in a P substrate 312. Two space-apart gate electrodes 322a and 322b are formed on the P substrate 312. Gate dielectric layers 324a and 324b are provided between respective gate electrodes 322a and 322b and the substrate 312. A deep N well 336 is formed in the P substrate 312.

An N+ drain region 350 is formed in the deep N well 336 and is disposed approximately at the midpoint between gate electrodes 322a and 322b. According to the third preferred embodiment, STI region 332 comprising several sub-STI regions 332a is provided between the N+ drain region 350 and the gate electrode 322a and STI region 334 comprising several sub-STI regions 334a is provided between the N+ drain region 350 and the gate electrode 322b. Similarly, dummy diffusion regions 420 are provided between sub-STI regions 332a and dummy diffusion regions 440 are provided between sub-STI regions 334a. The gate electrode 322a covers a portion of the sub-STI region 332a, while the gate electrode 322b covers a portion of the sub-STI region 334a. By disposing the dummy diffusion regions in the STI regions 332 and 334, the saturation drain current ($I_{DS}$) and the breakdown voltage of the device can both be improved.

According to the third preferred embodiment, the width of each dummy diffusion region and the space between two adjacent dummy diffusion regions are equal. For example, both the width of each dummy diffusion region and the space between two adjacent dummy diffusion regions are 0.5 micrometers. It has been experimentally confirmed that as the width of each dummy diffusion region gets larger, the gain of the saturation drain current ($I_{DS}$) increases as well. According to such experimental results, it is thus recommended that the width of each dummy diffusion region be made as large as possible in order to obtain larger $I_{DS}$.

Still referring to FIG. 4, the high-voltage LDMOS device 400 further comprises a peripheral STI region 338 provided for isolating the high-voltage LDMOS device 400 from other devices. Likewise, P+ guard ring diffusion region 550 is provided underneath the peripheral STI region 338 to surround the high-voltage LDMOS device 400. On one side of each gate electrodes 322a and 322b that is opposite to the drain 350, a source region 510 is provided in the deep N well 336. According to the third preferred embodiment, the source region 510 comprising an N$^+$ region 512 adjacent to each gate electrodes 322a and 322b and a P$^+$ region 514 butting on the N$^+$ region 512. The source region 510 further comprise a P well 516 encompassing the butting N$^+$ region 512 and P$^+$ region 514.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high-voltage metal-oxide-semiconductor (MOS) device, comprising:
    a semiconductor substrate of a first conductivity type;
    a drift ion well of a second conductivity type formed in said semiconductor substrate;
    a first isolation region formed in said drift ion well;
    a gate electrode formed on said semiconductor substrate and covering a portion of said first isolation region;
    a drain doping region of said second conductivity type disposed adjacent to said first isolation region on an opposite side to said gate electrode;
    a second isolation region formed in said drift ion well, said second isolation region being disposed adjacent to said drain doping region, wherein said second isolation region does not contact with any conductive layer; and
    a first dummy diffusion region of said second conductivity type in said drift ion well, said dummy diffusion region being disposed at a side of said second isolation region opposite to said drain doping region.

2. The high-voltage MOS device according to claim 1 wherein said high-voltage MOS device further comprises a third isolation region disposed at a side of said first dummy diffusion region opposite to said second isolation region.

3. The high-voltage MOS device according to claim 2 wherein said high-voltage MOS device further comprises a guard ring diffusion region of said first conductivity type disposed underneath said third isolation region.

4. The high-voltage MOS device according to claim 1 wherein said high-voltage MOS device further comprises a second dummy diffusion region of said second conductivity type disposed in said first isolation region.

5. The high-voltage MOS device according to claim 1 wherein said high-voltage MOS device further comprises a gate dielectric layer interposed between said gate electrode and said semiconductor substrate.

6. The high-voltage MOS device according to claim 1 wherein said first conductivity type is P type and said second conductivity type is N type.

7. The high-voltage MOS device according to claim 1 wherein said first conductivity type is N type and said second conductivity type is P type.

8. The high-voltage MOS device according to claim 1, further comprising a source doping region disposed within said drift ion well at one side of said gate electrode opposite to said drain doping region.

9. The high-voltage MOS device according to claim 1, wherein said drain doping region is a common drain doping region used by another said high-voltage MOS device, so that the drain doping region is at a midpoint between said two high voltage MOS device.

10. The high-voltage MOS device according to claim 9, further comprising a source doping region disposed within said drift ion well at one side of said gate electrode opposite to said drain doping region.

* * * * *